United States Patent
Hamamoto

(10) Patent No.: US 6,189,129 B1
(45) Date of Patent: Feb. 13, 2001

(54) FIGURE OPERATION OF LAYOUT FOR HIGH SPEED PROCESSING

(75) Inventor: Takeshi Hamamoto, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/092,650

(22) Filed: Jun. 9, 1998

(30) Foreign Application Priority Data

Jun. 9, 1997 (JP) .................................... 9-151235

(51) Int. Cl.$^7$ .................................................. G06F 17/50
(52) U.S. Cl. .................... 716/5; 716/4; 716/8; 716/19; 345/127; 345/423; 345/504; 345/507
(58) Field of Search ................. 716/5, 4, 8, 19; 345/423, 127, 507, 504; 364/489, 490, 491

(56) References Cited

U.S. PATENT DOCUMENTS

| | | | | |
|---|---|---|---|---|
| 5,392,222 | * | 2/1995 | Noble ...................................... | 716/19 |
| 5,490,083 | * | 2/1996 | Toyonaga et al. ....................... | 716/4 |
| 5,691,913 | * | 11/1997 | Tsuchida et al. ....................... | 716/8 |
| 5,771,045 | * | 6/1998 | Ghavam et al. ....................... | 345/423 |
| 5,838,335 | * | 11/1998 | Hamamoto ............................ | 345/507 |
| 5,910,795 | * | 6/1999 | Whittaker ............................. | 345/127 |
| 5,936,642 | * | 8/1999 | Yumoto et al. ....................... | 345/504 |
| 5,999,726 | * | 12/1999 | Ho ........................................ | 716/5 |
| 6,008,822 | * | 12/1999 | Yumoto et al. ....................... | 345/507 |

FOREIGN PATENT DOCUMENTS

| | | |
|---|---|---|
| 5-029187 | * 2/1993 | (JP) . |
| 5-29187 | 2/1993 | (JP) . |
| 5-206275 | * 8/1993 | (JP) . |
| 6-162139 | * 6/1994 | (JP) . |
| 8-063508 | * 3/1996 | (JP) . |
| 8-63508 | 3/1996 | (JP) . |
| 9-289252 | 11/1997 | (JP) . |
| 10-301973 | * 11/1998 | (JP) . |

OTHER PUBLICATIONS

Sawada, "A Hierarchical Circuit Extractor Based on New Cell Overlap Analysis" *IEEE* pp. 2400–2430 (1990).

* cited by examiner

*Primary Examiner*—Paul R. Lintz
*Assistant Examiner*—Jibreel Speight
(74) *Attorney, Agent, or Firm*—Foley & Lardner

(57) ABSTRACT

In a method of processing figure arrays in a figure processing apparatus, first and second figure arrays are sequentially inputted. A fractionalizing process is selectively performed to divide each of figure elements of the second figure array into a plurality of types of fractions based on presence/non-presence of an overlapping portion between the first and second figure arrays and an array data of the second figure array. The array data indicates an array pitch in each of horizontal and vertical directions and a number of figures in the direction. A figure array of fractions is produced for each type and the produced figure arrays are registered in chain groups which includes a chain group of the first figure array, such that the registered figure arrays have the same array data. Then, a figure operating process is performed to the chain group.

3 Claims, 19 Drawing Sheets

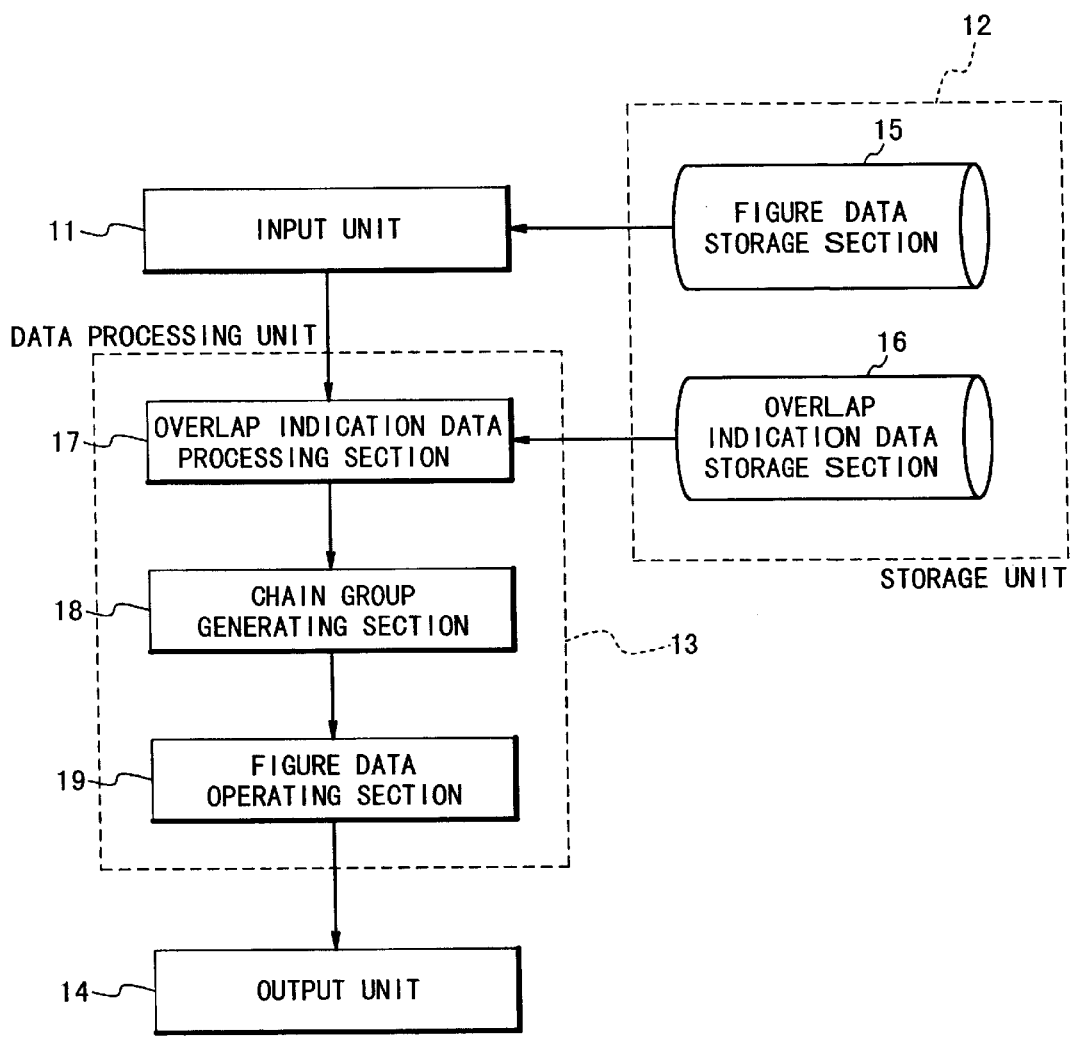

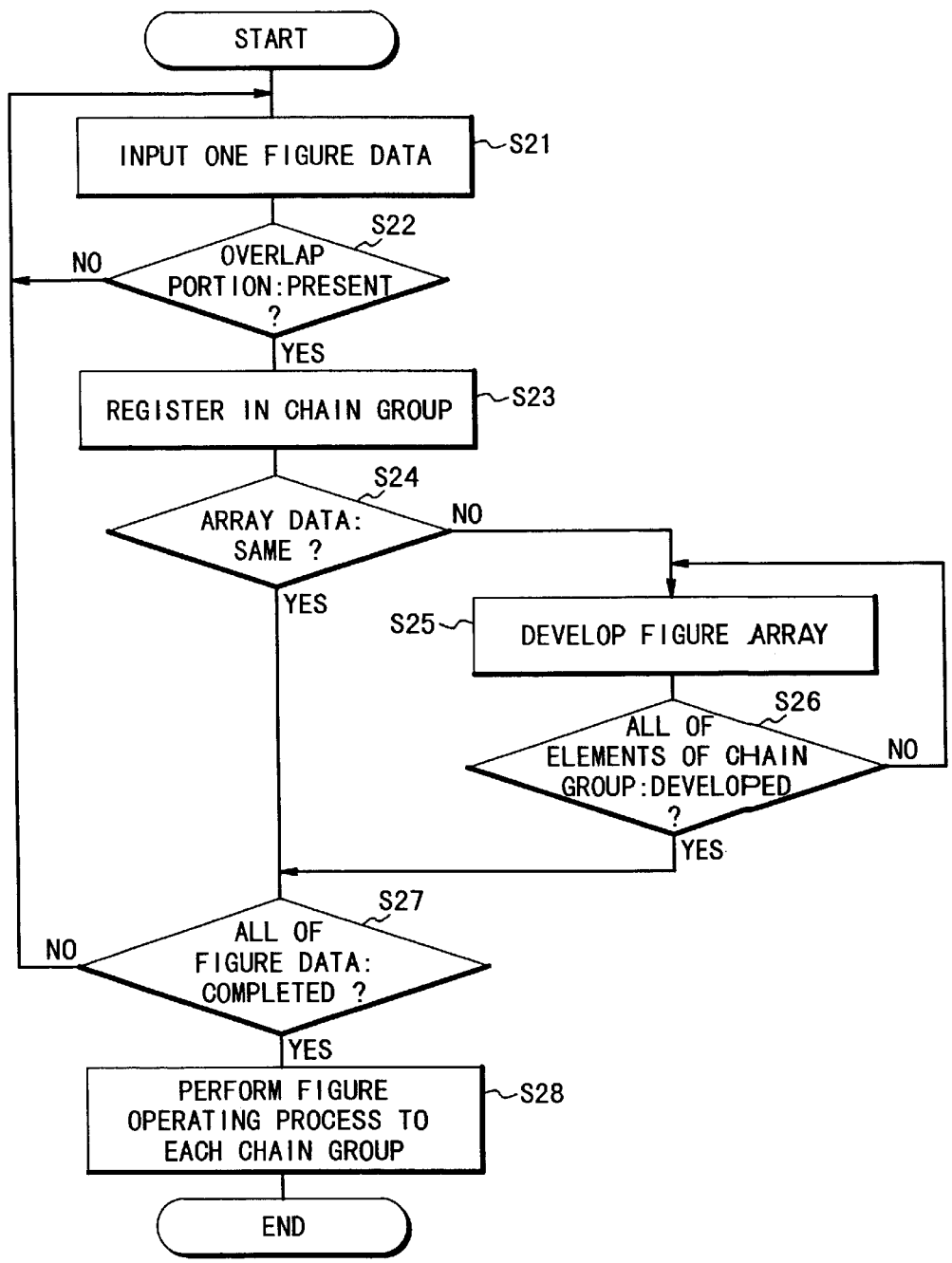

Fig. 4A PRIOR ART
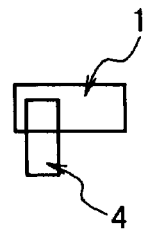
Fig. 4B PRIOR ART
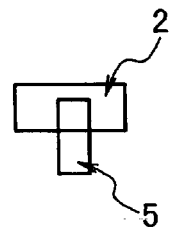
Fig. 4C PRIOR ART
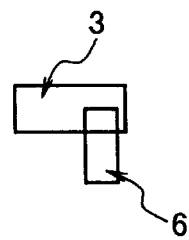
Fig. 4D PRIOR ART
| 1 → 4 |
|---|
| 2 → 5 |
| 3 → 6 |

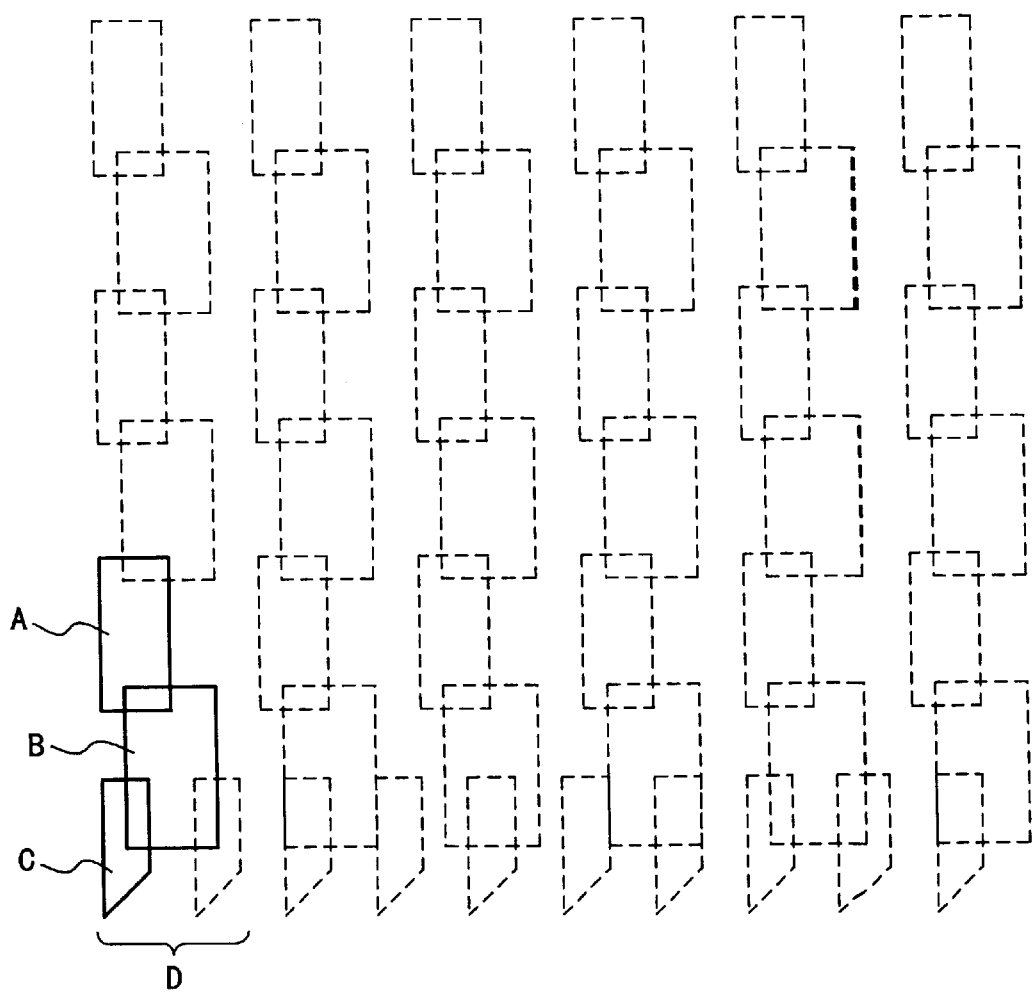

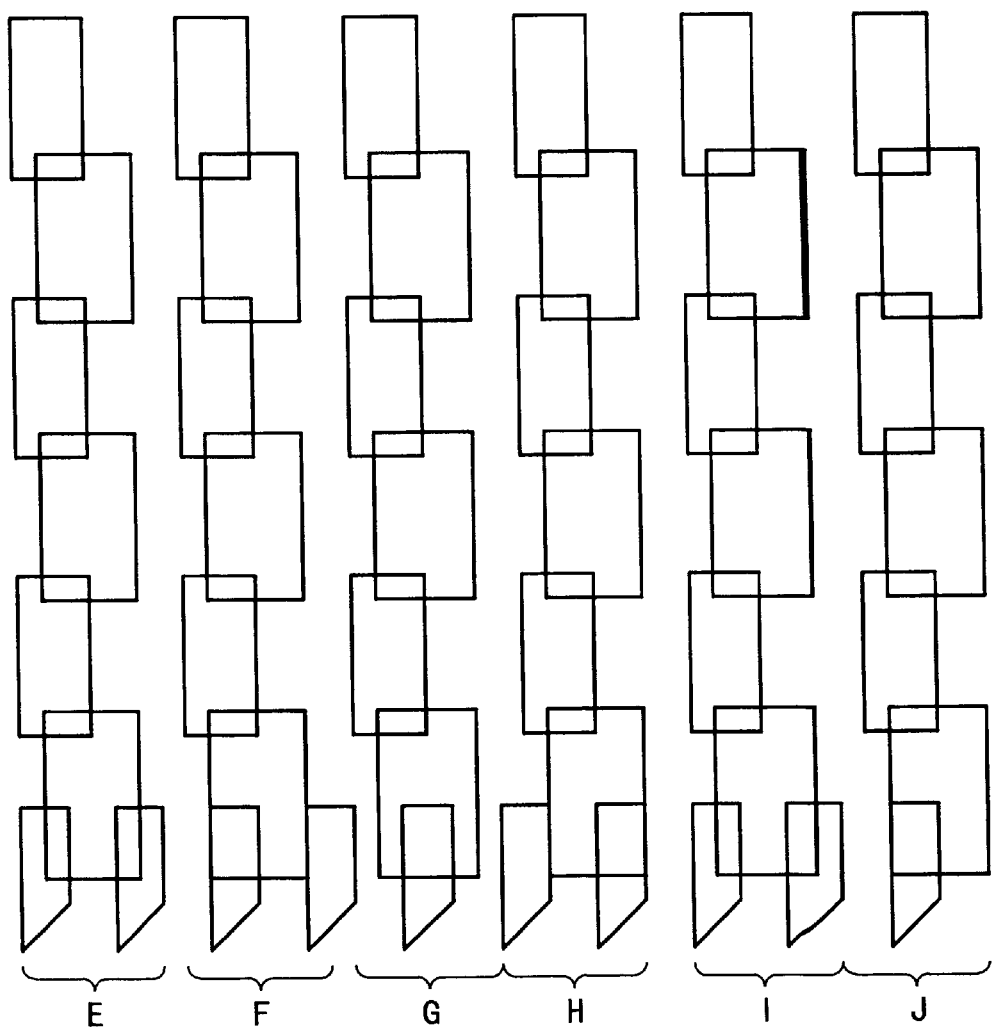

FIGURE OPERATION OF LAYOUT FOR HIGH SPEED PROCESSING

BACKGROUND OF THE INVENTION

1. Field of the Invention

The present invention relates to a layout verifying system for an integrated circuit, and more particularly to a layout verifying system for layout data of a semiconductor integrated circuit which contains a large amount of repetitive figure data.

2. Description of the Related Art

Layout data of a semiconductor integrated circuit is expressed as a set of figures each of which a plurality of polygons are combined. The number of figures of the layout data is generally large, as many as tens of millions. Therefore, a lot of time and computer resources are necessary to process the layout data by a computer.

As one design process which is performed to the layout data of such an integrated circuit, there is layout verification. The layout verification is mainly divided into physical size verification (DRC) and circuit connection verification (LVS). When the layout verification is performed, it is necessary to perform a figure operating process to the layout data which is composed of a plurality of figures. Here, the figure operating process to the figures means a logic summation of the overlapping figures, a logic product between overlapping figures, and/or transformation of a figure such as expansion, and reduction. By performing such a figure operating process, the figure data can be re-formed to internal data which matches the layout verification such as the DRC and the LVS. For this reason, in the layout verifying system, the figure operating process is an extremely important process.

Especially, in the layout data of an integrated circuit such as a DRAM, a portion of the layout data is composed of a plurality of figures, which are arranged repetitively and periodically. Therefore, when a figure operating process is performed to the layout data of the integrated circuit, it is needed that the figure operating process can be performed at high speed to the figures which are arranged repetitively and periodically.

Next, the repetitive figures and the figure operating process will be described below.

For the figures which are arranged repetitively and periodically, it is generally possible to be expressed by a figure data composed of shape data and position data of a figure element as a basic unit and an array data, as shown in FIGS. 3A and 3B. The shape data represents the shape of the figure element and the position data represents the position coordinate of the figure element. Such repetitive and periodic figures are referred to as a figure array hereinafter. The array data represents the arrangement pitches between the figure elements in horizontal and vertical directions and arrangement numbers of figure elements in horizontal and vertical directions.

The figure data of the figure array and the array data thereof are stored in a memory in case of computer processing, as shown in FIG. 3B. This data structure needs only a small memory capacity, compared with the case which data representing figures are distributedly stored in the memory. Thus, when a great deal of figure data are processed, it is very important how many figure data can be manipulated as the figure array.

To perform a figure operating process, a data representing the overlapping between the figures, i.e., an overlap indication, data is necessary in addition to the figure data and the array data. This is expressed as a set of identifications, each of which is allocated for each figure data, as shown in FIGS. 4A to 4D. This data is referred to as an overlap indication data.

An actual figure operating process is performed not to each of the figure data but to a group of figure data for figures which overlap each other. More specifically, the figure data where can be traced in accordance with the overlapping portions are collected into a group. Hereinafter, these groups are referred to as chain groups, as shown in FIG. 5A to 5C by a reference numeral 93, 94 and 95, respectively. The results that the figure operating process of logic summation is performed to the chain groups 90, 91 and 92 are shown in FIGS. 5A to 5C by reference numerals 93, 94 and 95, respectively. In this way, when the figure operating process is performed, the inputted figure data must be first grouped into the chain groups based on the overlap indication data and then processed.

A conventional figure processing apparatus for the figure array will be explained with reference to FIGS. 1 to 8.

The structure of the conventional figure processing apparatus will be explained with reference to a system block diagram of FIG. 1. As shown in FIG. 1, the conventional figure processing apparatus is composed of an input unit 11 for inputting figure data, a storage unit 12 for storing the figure data and an overlap indication data, a data processing unit 13 for performing a figure operating process to the figure data based on the overlap indication data, and an outputting unit 14 for outputting the processing result. The storage unit 12 is composed of a figure data storage section 15 for storing the figure data, and an overlap indication data storage section 16 for storing the overlap indication data. Also, the data processing unit 13 is composed of an overlap indication data processing section 17 for inputting the overlap indication data to process, a chain group generating section 8 for producing a chain group from the overlap indication data and a figure data operating section 19 for performing a figure operating process for every chain group.

The operation when an figure array is processed by the conventional figure processing apparatus will be described with reference to a flow chart of FIG. 2.

The figure data is sequentially read from the figure data storage section 12 one by one. Here, the case that the read figure data is for a figure array will be described.

First, a figure array C is read from the figure data storage section 15 by the inputting unit 11 (step S21). Next, if the overlap indication data of the figure array C is present (yes in step S22), the overlap indication data processing section 17 reads the overlap indication data from the overlap indication data storage section 16. At this time, as shown in FIG. 6, because the figure data A and B are present which can be traced based on the overlap indication data, the figure data C is registered in a chain group in which the figure data A and B have been already registered (step S23). In case of the registration of the figure data C, it is determined whether the array data of the figure array C is coincident with the array data of figure arrays A and B (Step S24).

If the array data are both coincident with each other, the figure array can be registered in the chain group as it is. However, as shown in FIG. 6, when the array data of the figure array C is different from those of the figure arrays A and B, the figure C is not possible to be processed as the same figure array as the figure array A or B. In accordance with, the figure array C must be developed as a plurality of figures. Also, because figures of the chain group are connected to have overlapping portions, all the figures of the figure arrays must be developed when one of the figures of the figure array is developed. If not, the figure operating process can not be performed. This means that the figures of the figure array B are developed based on the figure array C and also the figures of the figure array A are developed based on the figure array B (Steps S25 and S26).

In this manner, the chain group ABC is divided into chain groups E to J, as shown in FIG. 7. If all the inputted figures are registered on the chain groups (yes in step S27), the figure operating process is performed to each of the chain groups (step S28). FIG. 8 shows the result of the logic summation of the figure operating process to the figure arrays A, B and C. Lastly, a figure operating process result is outputted.

The primary problem is in that if a figure array has different array data from already registered figure arrays, the figure operating process must be performed, after the figure array is developed to the respective figures. The reason is that because the overlapping state between the figures depends on the arrangement position, the figure operating process result of the basic element figure can not be applied to the result of each arrangement position. If the array data of the figure array as the calculation object is the same, the figure operating process can be completed, when only the figure operating process to the figure element of the figure array in the lower left corner as a basic unit is performed. This is because all the overlapping states are the same over the other figures of the figure array, so that the figure operating process result can be applied to the other figures. On the contrary, the overlapping states are different between the respective figures if the array data are different. Therefore, the figure array needs that the figure operating process is performed for each figure after the respective figures are developed.

The second problem is in that when one figure of the chain group is developed, all the figures of the figure arrays which are contained in the chain group must be developed. The reason is that all the figures of the figure arrays which are contained in the chain group are connected via the overlapping portions one after another. For this reason, if the same array data is set to the figures having the overlapping portion, all the figures of the figure arrays must be developed when one of the figures of the figure arrays is developed.

In addition, a layout verifying system is disclosed in Japanese Laid Open Patent Disclosure (JP-A-Heisei 6-162139). In this reference, before layout verification is executed, a figure array is changed of layout components of a memory matrix such as a memory cell M, a row decoder amplifier X, a column decoder amplifier Y, a sense amplifier S and latch circuits L. Also, the figure array is shifted toward an original one of the figures of the figure array to re-structure of the figure array. Thus, the layout verification of a memory matrix is made possible.

SUMMARY OF THE INVENTION

The present invention is accomplished in view of the above problems. Therefore, an object of the present invention is to provide a figure processing apparatus which can perform a figure operating process at high speed.

Another object of the present invention is to provide a figure processing apparatus in which the capacity of a storage unit can be reduced so as to have a small size.

Still another object of the present invention is to provide a figure processing apparatus in which the number of figure data to be processed can be reduced.

In order to achieve an aspect of the present invention, a method of processing figure arrays in a figure processing apparatus, includes the steps of:

sequentially inputting first and second figure arrays;

selectively performing a fractionalizing process to divide each of figure elements of the second figure array into a plurality of types of fractions based on presence/non-presence of an overlapping portion between the first and second figure arrays and an array data of the second figure array, the array data indicating an array pitch in each of horizontal and vertical directions and a number of figures in the direction;

producing a figure array of fractions for each type and registering the produced figure arrays in chain groups which includes a chain group of the first figure array, such that the registered figure arrays have the same array data; and performing a figure operating process to the chain group.

In the step of selectively performing a fractionalizing process, it is determined whether the overlapping portion is present between the first and second figure arrays. Also, it is determined whether the array data of the second figure array is same as that of the first figure array, when it is determined that the overlapping portion is present between the first and second figure arrays. Then, the fractionalizing process is performed when it is determined that the array data of the second figure array is not same as that of the first figure array.

In the step of performing a fractionalizing process, each of the figure elements of the second figure array is fractionalized into the plurality of types of fractions based on boundary lines of the overlapping portion. When position of the boundary lines change, the fractionalizing process is further performed to divide each of figure elements of the first figure array into a plurality of types of fractions.

In the step of performing a figure operating process, the figure operating process is performed to the chain groups such that the figure arrays having the same array data are processed in units of figure arrays and the figure arrays having individual array data are process in units of figure elements of each of the figure arrays. In this case, the figure operating process to the figure arrays of one chain group may be a logical summation figure operating process.

A new figure array is produce from the plurality of figure arrays which are subjected to the figure operating process, to reduce the number of figures.

The method desirably applied to a layout verification based on the figure arrays which are subjected to the figure operating process.

In order to achieve another aspect of the present invention, a figure processing apparatus includes an inputting unit for sequentially inputting first and second figure arrays, a fractionalizing unit for selectively performing a fractionalizing process to divide each of figure elements of the second figure array into a plurality of types of fractions based on presence/non-presence of an overlapping portion between the first and second figure arrays and an array data of the second figure array, the array data indicating an array pitch in each of horizontal and vertical directions and a number of figures in the direction, a registering unit for producing a figure array of fractions for each type and registering the produced figure arrays in chain groups which includes a chain group of the first figure array, such that the registered figure arrays have the same array data, and a figure operating unit for performing a figure operating process to the chain group.

BRIEF DESCRIPTION OF THE DRAWINGS

FIG. 1 is a block diagram illustrating the structure of a conventional figure processing apparatus;

FIG. 2 is a flow chart illustrating the operation of the conventional figure processing apparatus;

FIGS. 4A to 4D are diagrams to describe the operation of the conventional figure processing apparatus;

FIG. 6 is a diagram to describe the overlapping state of basic elements of the a figure array in the conventional figure processing apparatus;

FIG. 7 is a diagram to describe the whole of the figure array in the conventional figure processing apparatus;

DESCRIPTION OF THE PREFERRED EMBODIMENTS

Next, the figure processing apparatus of a layout verifying system of the present invention will be described below in detail with reference to the attached drawings.

Figure 3A:
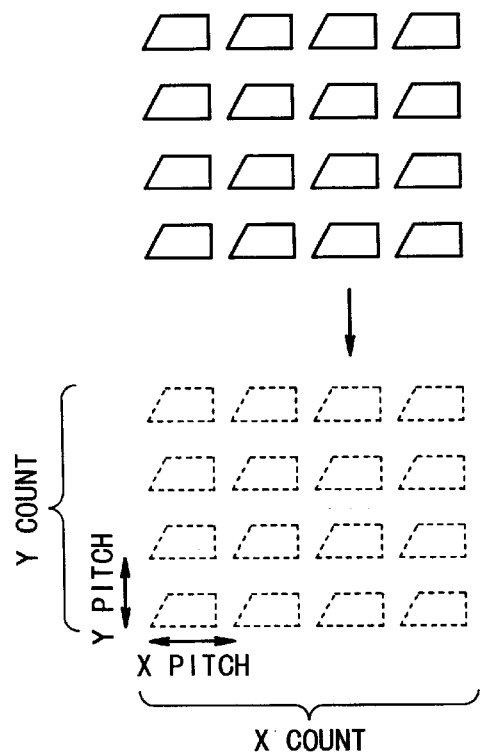
FIGS. 3A and 3B are diagrams to describe a figure array used in the conventional figure processing apparatus.
Figure 3B:
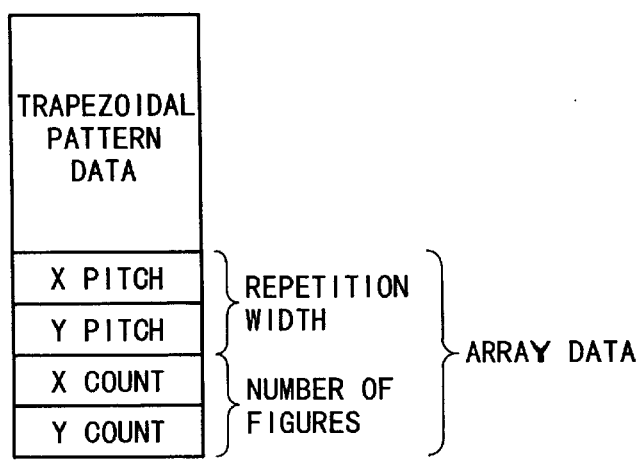
Figure 5A:
FIGS. 5A to 5C are diagrams to describe the operation of the conventional figure processing apparatus.
Figure 5B:
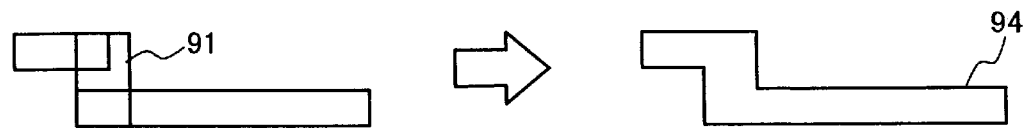
Figure 5C:
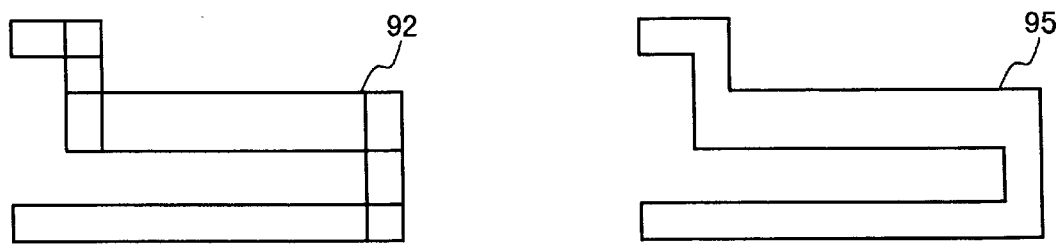
Figure 8:
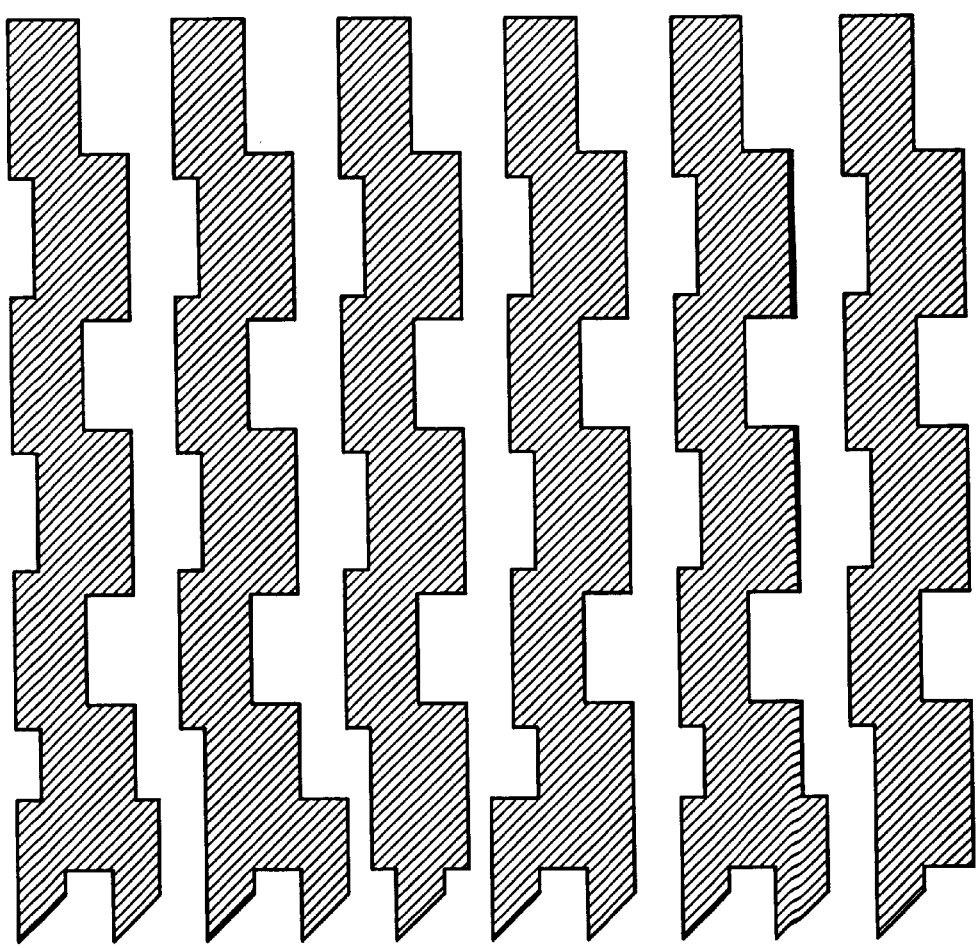
FIG. 8 is a diagram to describe a figure operating process result in the conventional figure processing apparatus.
Figure 9:
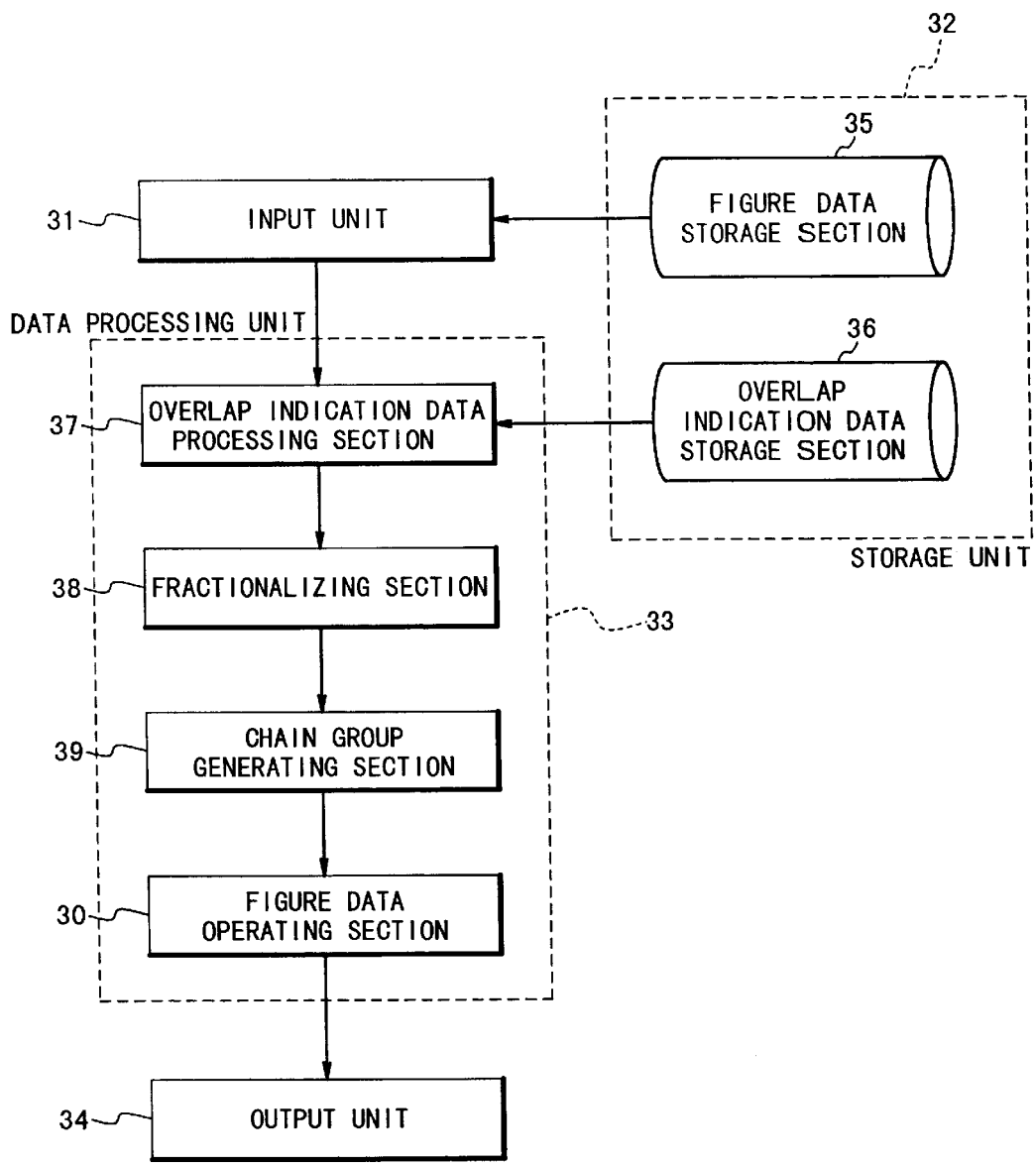
FIG. 9 is a block diagram illustrating the structure of the figure processing apparatus according to a first embodiment of the present invention.

FIG. 9 is a block diagram illustrating the structure of the figure processing apparatus according to the first embodiment of the present invention. Referring to FIG. 9, the figure processing apparatus according to the first embodiment of the present invention is composed of an inputting unit 31 for inputting a figure data, a storage unit 32 for storing data, a data processing unit 33 for performing a figure operating process and an outputting unit 34 for outputting the result of the figure operating process.

Also, the storage unit 32 is composed of a figure data storage section 35 for storing the figure data and an overlap indication data storage section 36 for storing overlap indication data. The data processing unit 33 is composed of an overlap indication data processing section 37 for interpreting the overlap indication data, a fractionalizing section 38 for fractionalizing the figure data based on the overlap indication data, a chain group generating section 39 for generating a chain group of figure arrays which overlap via overlapping portions, and a figure data operating section 30 for performing a figure operating process for every chain group.

Figure 10:
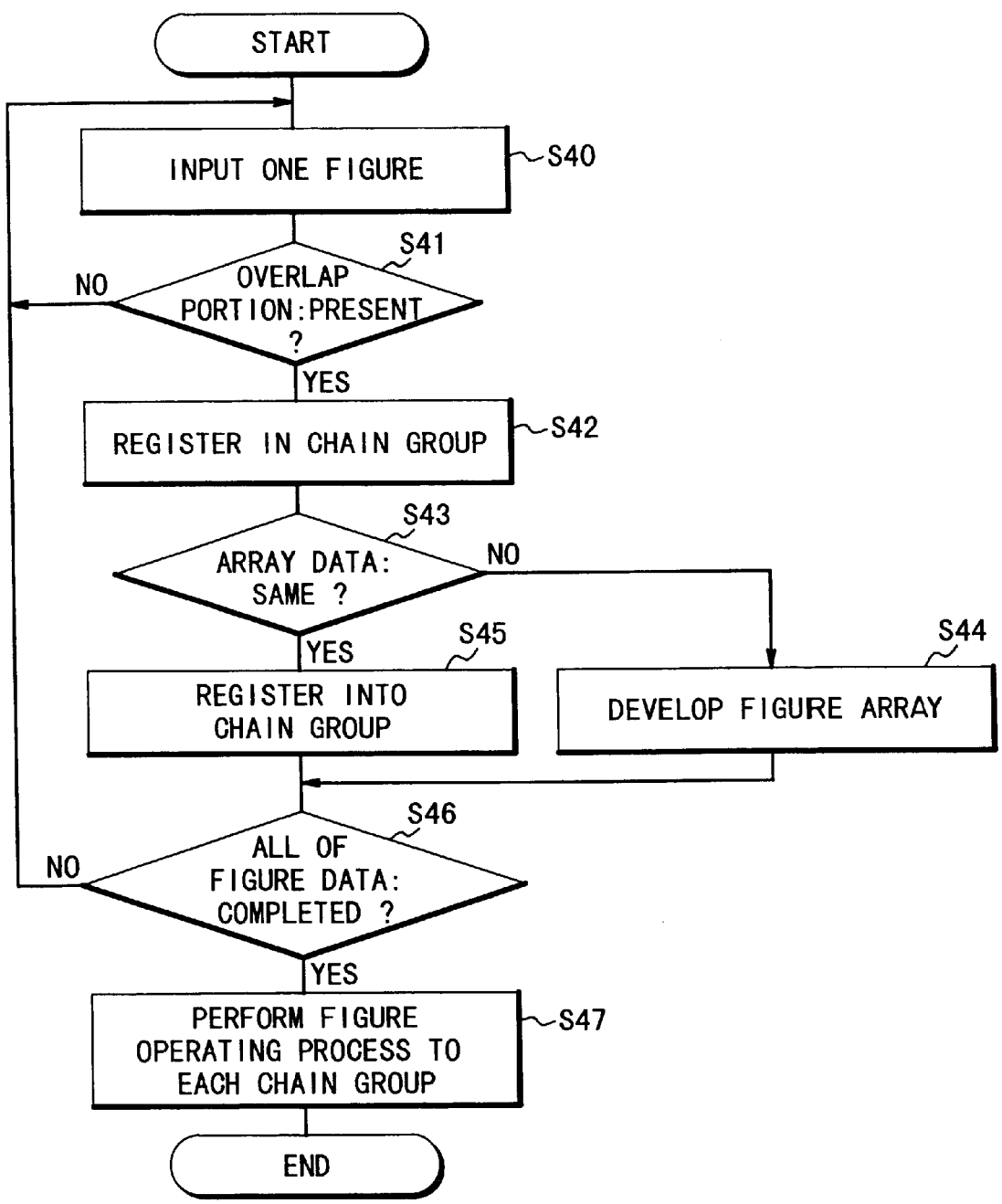
FIG. 10 is a flow chart illustrating the operation of the figure processing apparatus according to the first embodiment of the present invention.

Next, the logic summation figure operating process of three figure arrays A, B, C which are the same as those shown in FIG. 6 in the first embodiment will be described with reference to the flow chart of FIG. 10 and examples of FIGS. 13A to 15.

First, the figure array A is inputted, and then the figure array B is inputted. The figure array B has an overlapping portion with the figure array A and the array data of the figure array B is same as that of the figure array A. Therefore, the figure arrays A and B are possible to be processed as one figure array contained in the same chain group as they are. Thus, the figure arrays A and B are registered in a chain group K.

Next, the case where the figure array C having a different array data from the figure arrays A and B is inputted will be described.

It is found based on the overlap indication data that the figure array C has an overlapping portion with the figure array B (Step S41). Subsequently, a fractionalizing process is performed to the figure array B and the figure array C (Step S42). As shown in FIGS. 13A to 13D, the fractionalizing process is the process in which the figure arrays B and C are divided into the fractional area where only a part of the figure array B exists, the fractional area where both of parts of the figure array B and figure array C exist together, and the fractional area where only a part of the figure array C exists in accordance with the upper line and lower line of the overlapping portion. The figure array B and the figure array C are divided into the fractions X, Y and Z, as shown in FIGS. 13A to 13D.

Figure 14:
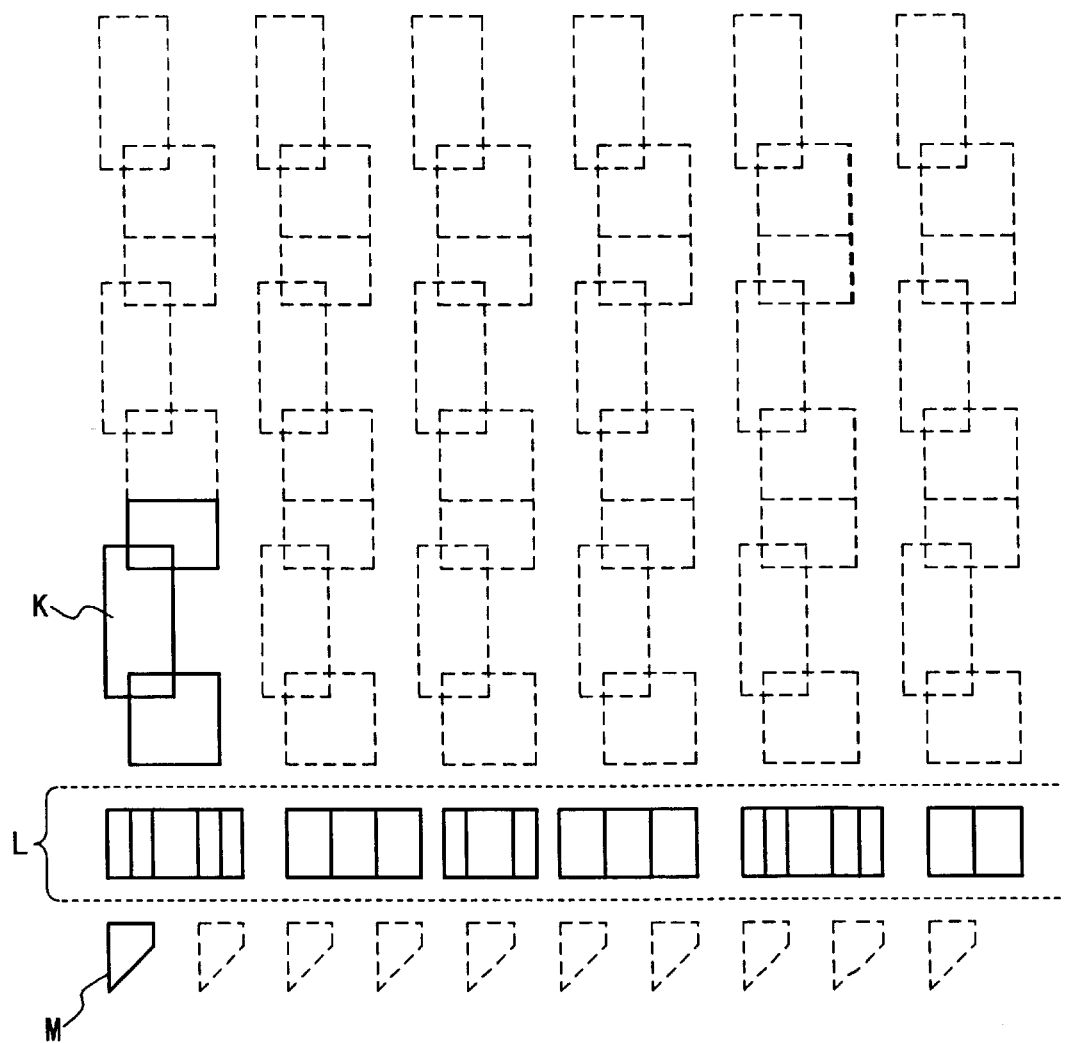
FIG. 14 is a diagram to describe the operation of the figure processing apparatus according to the first embodiment of the present invention.

Next, it is determined whether the array data of each of the fractions X, Y and Z is coincident with the array data of the chain group K (step S43). As a result, as shown in FIG. 14, because the array data of the fraction X is coincident with that of the chain group K, the fraction X is registered in the chain group K (step S45). However, because the array data of each of the fractions Y and Z is different from that of the chain group K, the fractions Y and Z are not registered in the chain group K (step S44). The figure operating process is performed as the data of another chain group. Thus, the fraction Y is set as the figure array L and the fraction Z is set as the figure array M. As a result, the chain groups K, L and M are complete (step S46).

Figure 15:
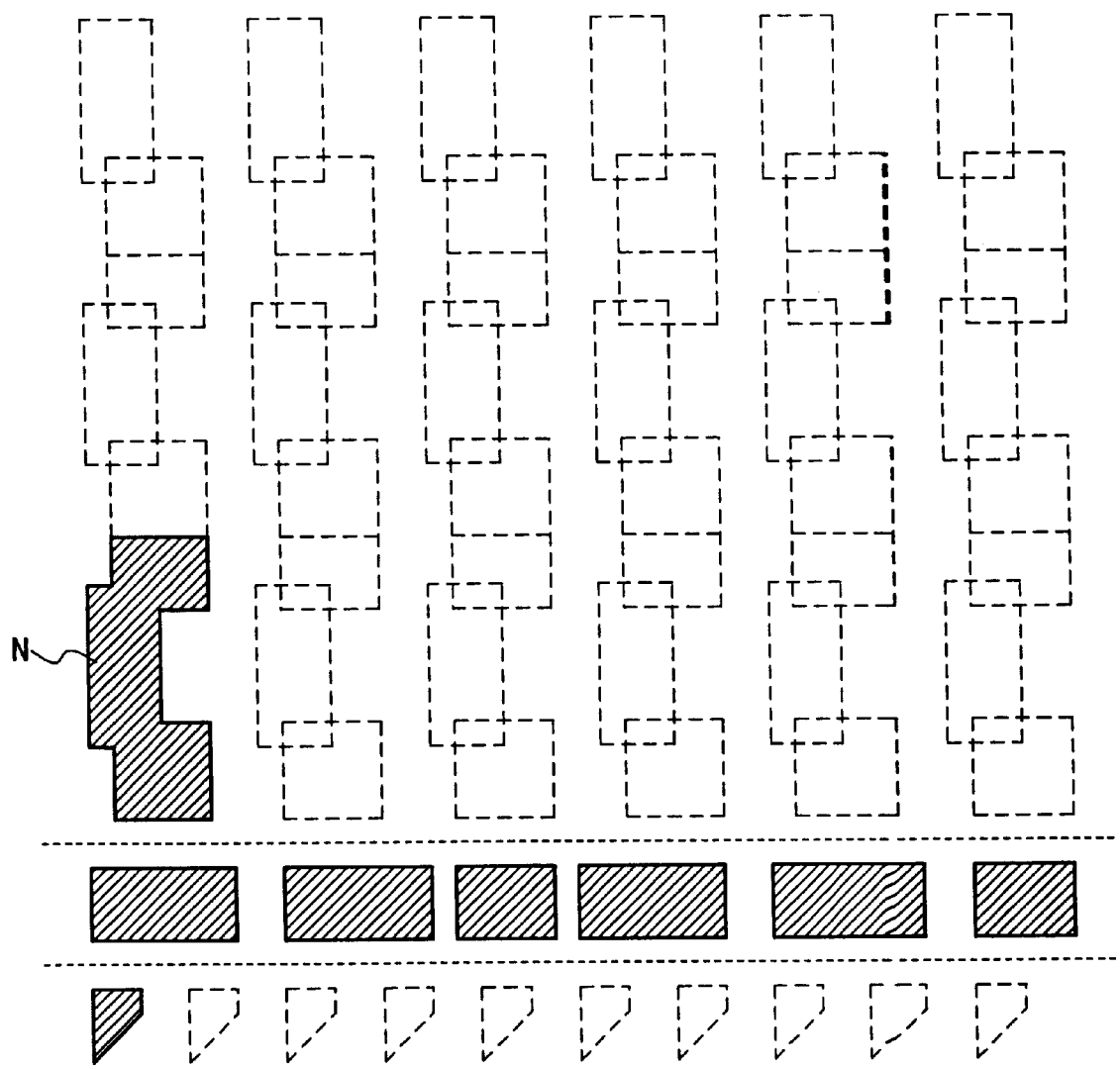
FIG. 15 is a diagram to describe a logical summation figure operating process of the figure processing apparatus according to the first embodiment of the present invention.

The logic summation calculation is performed to each of these chain groups to remove the overlapping portion by the figure data operating section 30 (step S47). FIG. 15 shows a figure operating process result. The figure array A can be subjected to the figure operating process without being developed as it is. Also, the figure operating process result can be determined in the form of the figure array such as a figure array N.

The figure arrays are used for a layout verification in the present invention.

Figure 11:
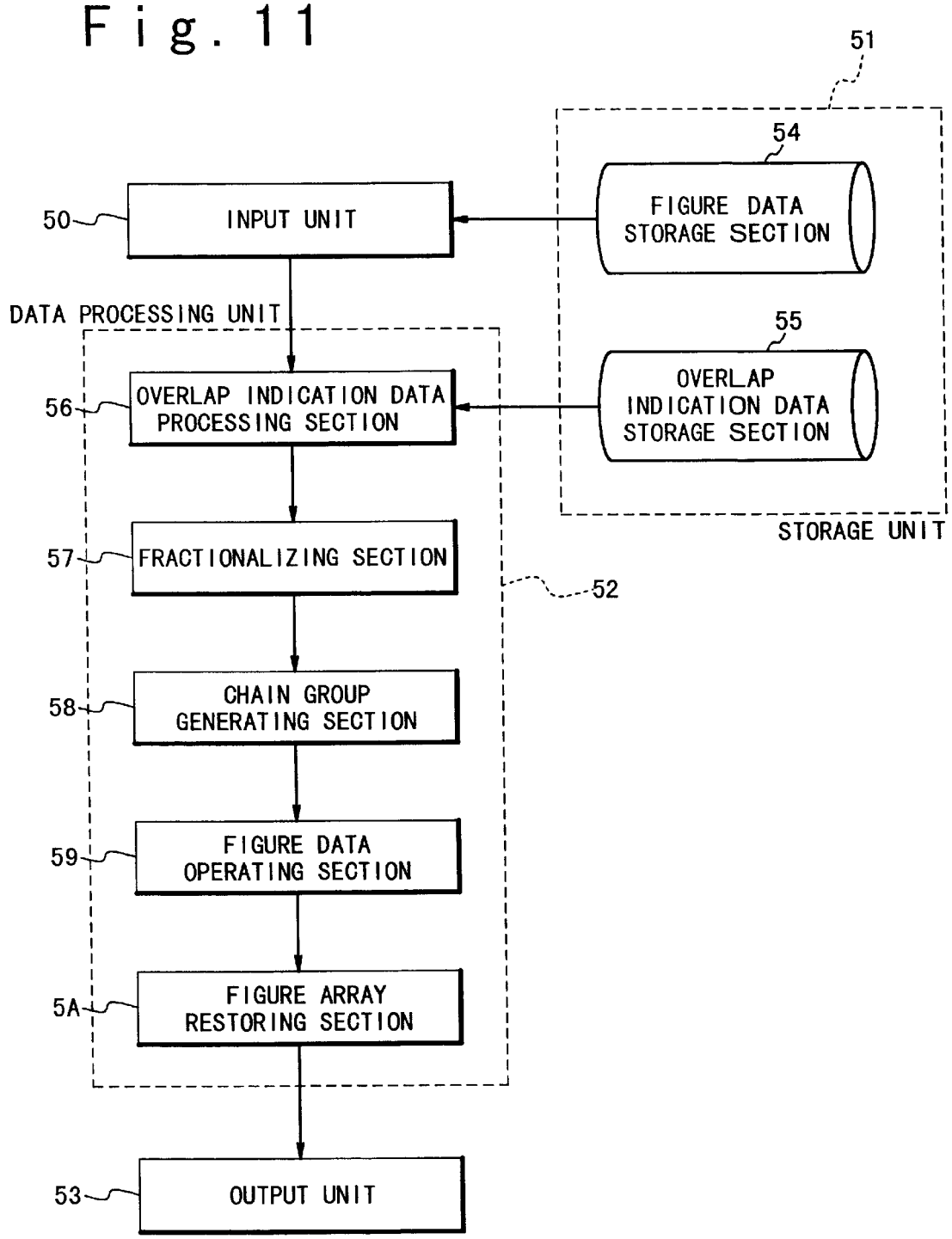
FIG. 11 is a block diagram illustrating the structure of the figure processing apparatus according to a second embodiment of the present invention.

FIG. 11 is a block diagram illustrating the structure of the figure processing apparatus according to the second embodiment of the present invention. Referring to FIG. 11, the figure processing apparatus according to the first embodiment of the present invention is composed of an inputting unit 50 for inputting a figure data, a storage unit 51 for storing data, a data processing unit 52 for performing a figure operating process and an outputting unit 53 for outputting the result of the figure operating process.

Also, the storage unit 51 is composed of a figure data storage section 54 for storing the figure data and an overlap indication data storage section 55 for storing overlap indication data. The data processing unit 52 is composed of an overlap indication data processing section 56 for interpreting the overlap indication data, a fractionalizing section 57 for fractionalizing the figure data based on the overlap indication data, a chain group generating section 58 for generating a chain group of figure arrays which overlap via overlapping portions, a figure data operating section 59 for performing a figure operating process for every chain group, and a figure array restoring section 5A for restoring figures into a figure array.

Next, the operation of the figure processing apparatus in the second embodiment will be described below with reference to FIG. 12.

Figure 16:
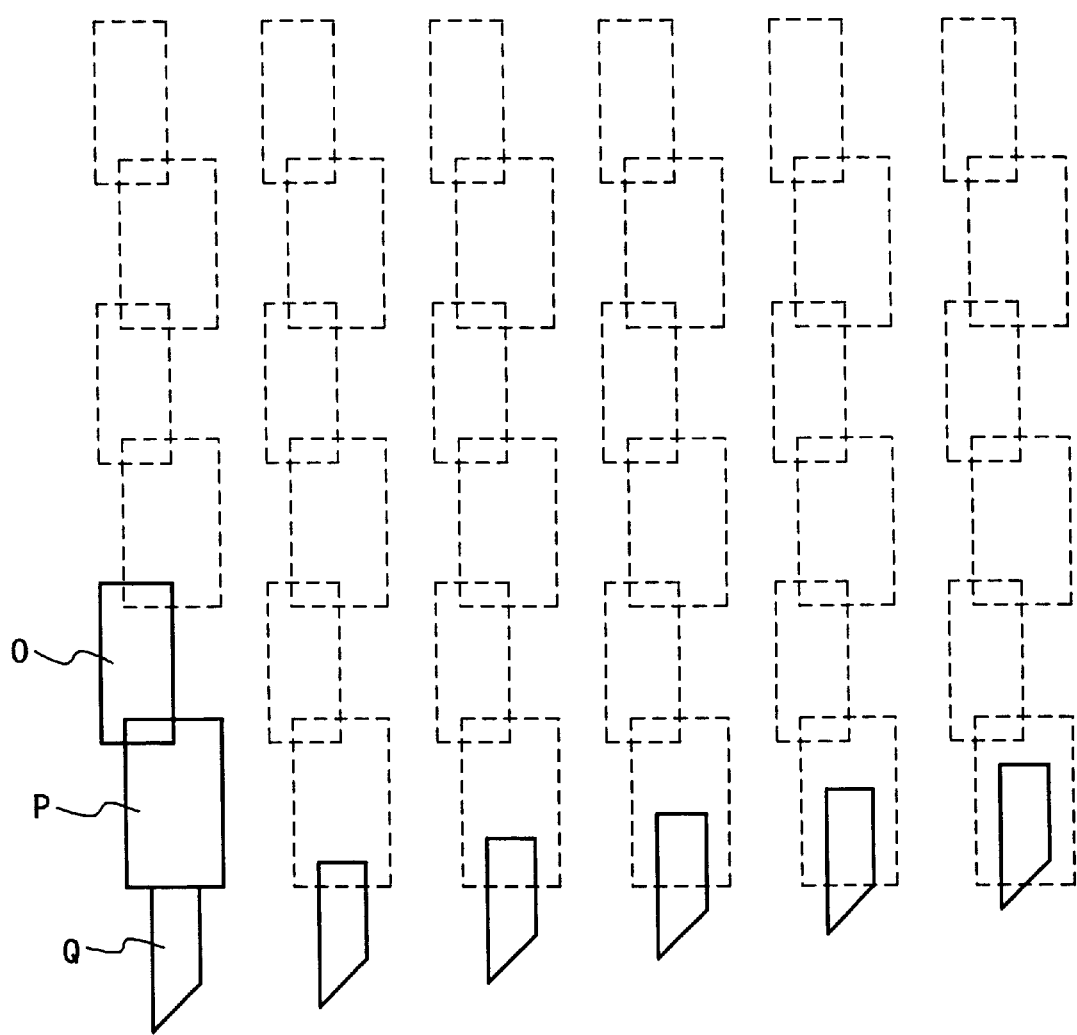
FIG. 16 is a diagram to describe figure arrays in the figure processing apparatus according to the second embodiment of the present invention.

In the second embodiment of the figure processing apparatus, the logic summation figure operating process when three figure arrays O, P and Q overlap as shown in FIG. 16 will be described with reference to the flow chart of FIG. 12 and FIGS. 16 to 19. In FIG. 12, the steps 60 to 67 are same as the steps S40 to S47 in FIG. 10.

As shown in FIG. 16, the difference of the second embodiment from the first embodiment is in that the overlapping portions of the figure array P and the figure array Q change in the upper direction.

Figure 12:
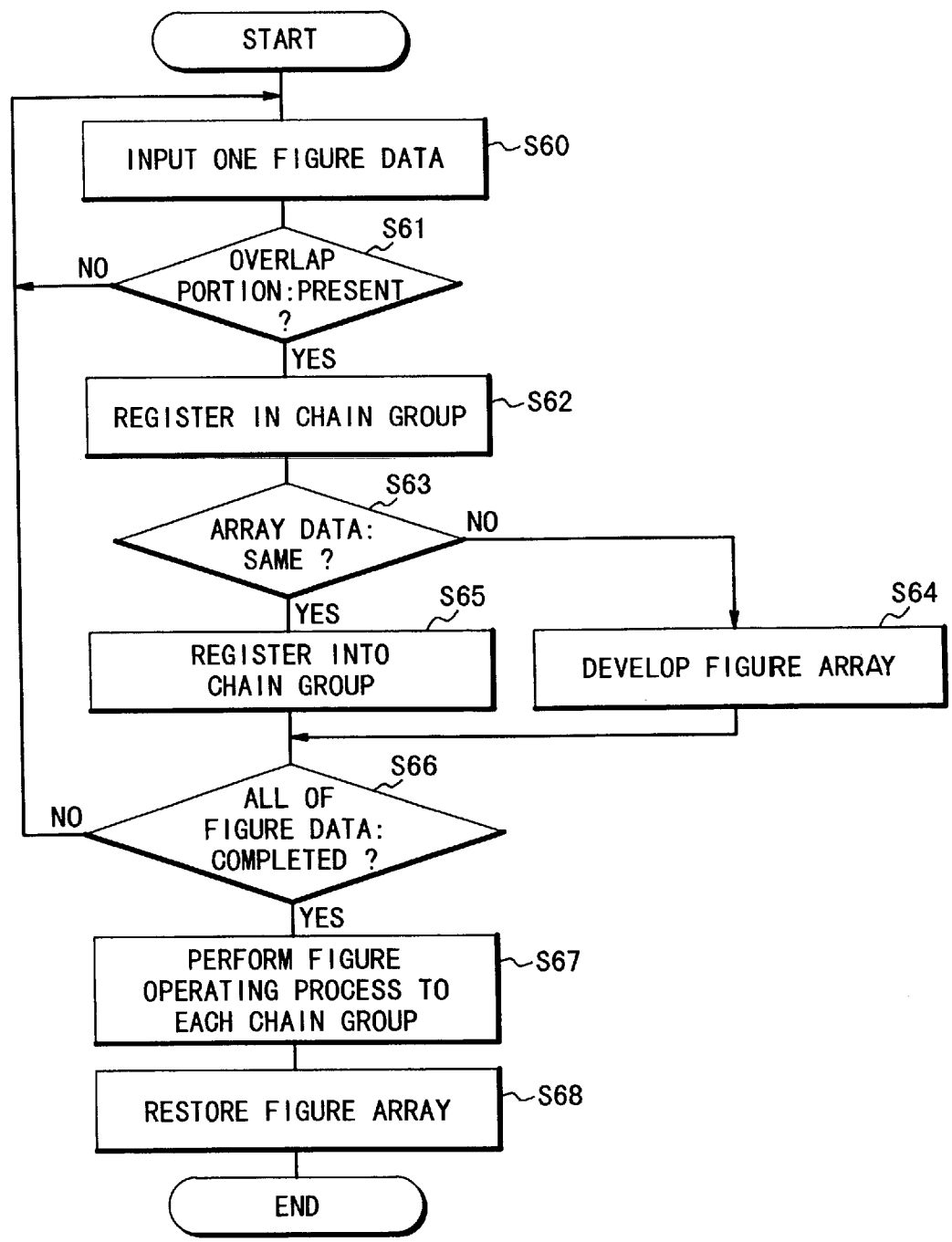
FIG. 12 is a flow chart illustrating the operation of the figure processing apparatus according to the second embodiment of the present invention.
Figure 13A:
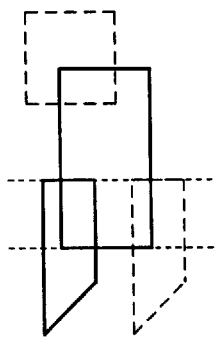
FIGS. 13A to 13D are diagrams to describe the fractionalizing process of the figure processing apparatus of the present invention.
Figure 13B:
Figure 13C:
Figure 13D:
Figure 17:
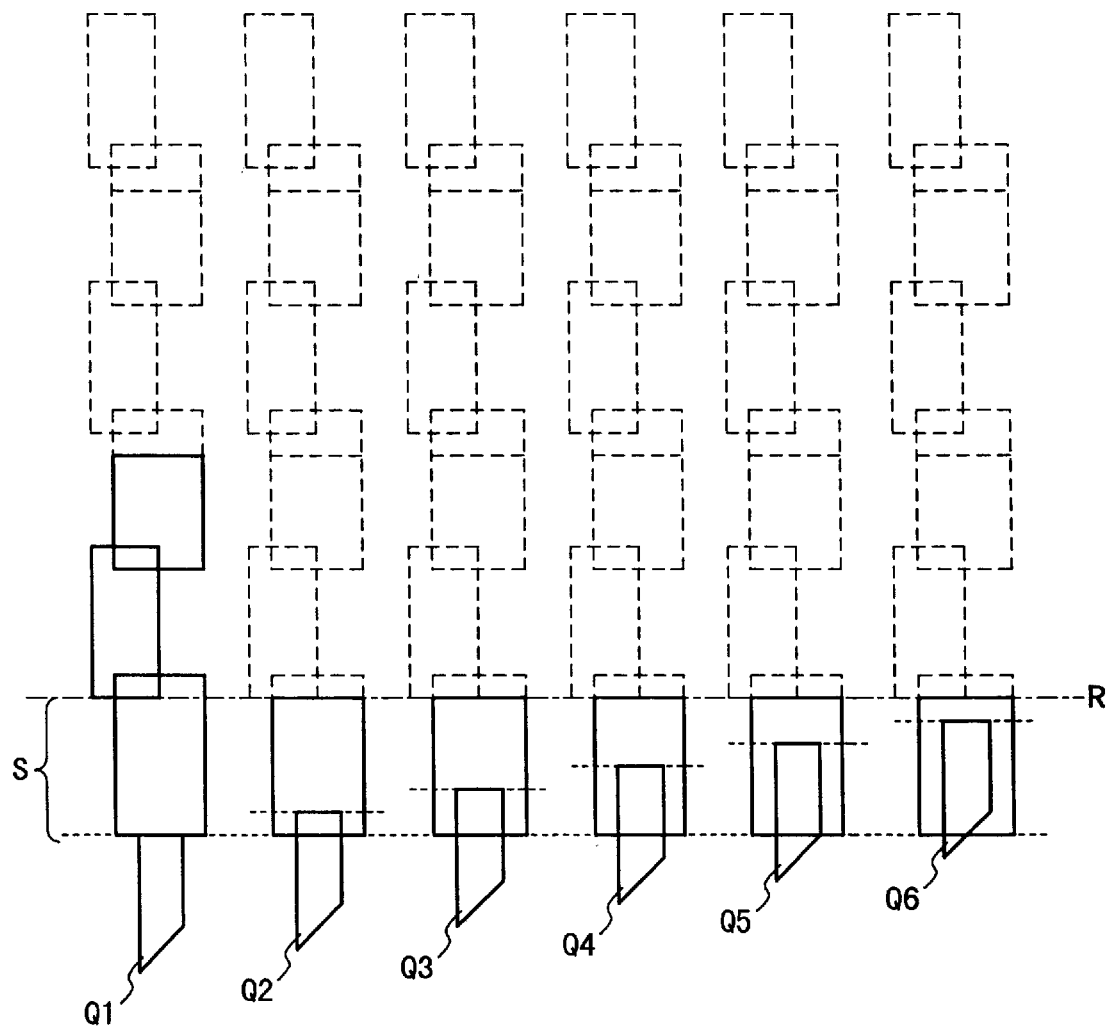
FIG. 17 is a diagram to describe a fractionalizing process of the figure processing apparatus according to the second embodiment of the present invention.
Figure 18:
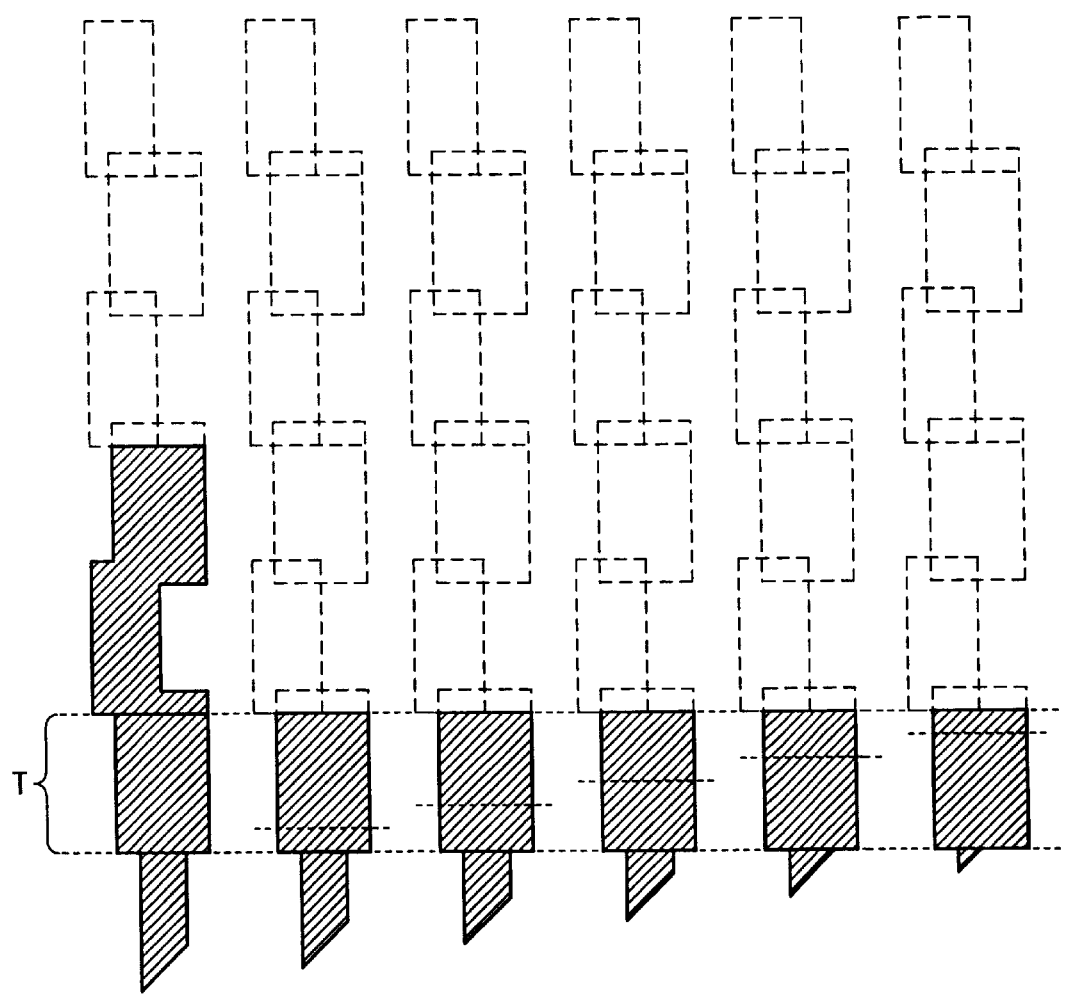
FIG. 18 is a diagram a logical summation figure operating process in the figure processing apparatus according to the second embodiment of the present invention.
Figure 19:
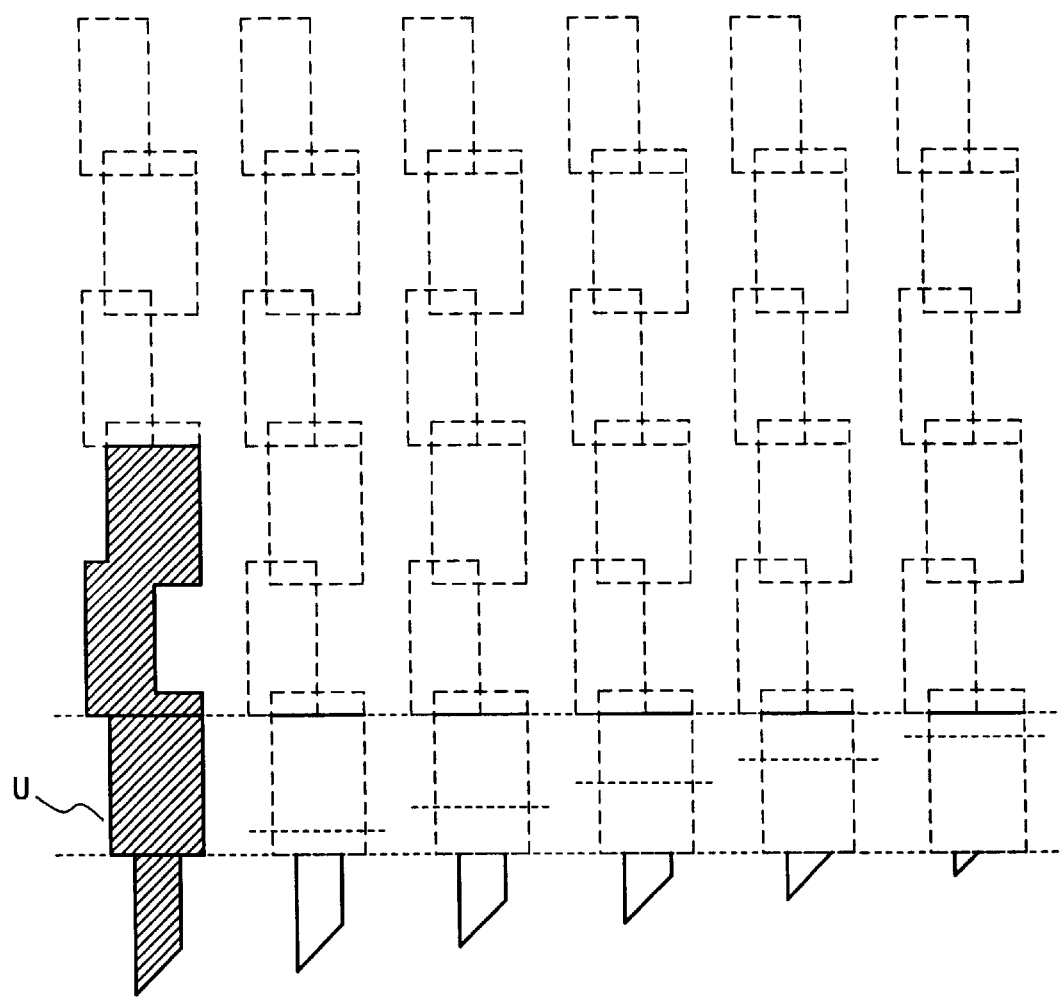
FIG. 19 is a diagram to describe the operation of the figure processing apparatus according to the second embodiment of the present invention.

The fractionalizing process is performed in accordance with the flow chart of FIG. 12 (step S62), after the figure data O and P are inputted and then the figure data Q. The fractionalizing process is performed in different overlapping portions because the elements of the figure array Q, i.e., figure elements Q1 to Q6, are different in the overlapping portions from each other, as shown in FIG. 17. For this reason, when the figure array P and the figure array Q can not be processed at the same time, even if the fractionalizing process is performed to the figure array P and the figure array Q to divide into fractions, the fractionalizing process is further performed to the figure array P and the figure array O. The figure array P can be fractionalized based on the overlap indication data between the figure array O and the figure array P using a line R as a boundary (Step S62). As the result of the fractionalizing process, the figure is possible to be grouped into a plurality of chain groups S, as shown in FIG. 17 (step S65). FIG. 18 shows the result of the logic summation figure operating process.

At this time, the figure group T is originally produced by performing the fractionalizing process to the same figure array P. Because this figure group T has the same shape and arrangement position as the original shape and arrangement position of the figure array P as the result of the figure operating process, the figures of the group T can be gathered again to one figure array, as shown in FIG. 18.

In this manner, the figures which can be gathered as one figure array after the figure operating process is performed are again gathered such that one figure array is restored (Step S68). This array restoring section 5A in FIG. 11 makes it possible to avoid a problem of increase of the number of figures to be processed which is caused by repetitively performing the figure operating process with the fractionalizing process.

As described above, according to the figure processing apparatus of the present invention, because it is possible to perform the figure operating process to the figure array, the memory quantity used by the program can be reduced. The reason is that the fractionalizing process is performed to the figure having an overlapping portion to divide the figure into fractions, so that the development of the figure array can be suppressed to a necessary minimum. As a result, because it is possible to continue to have the figure data in the form of the figure array, the memory quantity can be reduced to a small value from one-tenth to one-hundredth, compared with the case where an array is developed to have figure data.

The second effect is in that the processing time of the program can be shortened because it is possible to perform the figure operating process to the figure array. The reason is that in the figure operating process to the figure arrays, the figure operating process to the whole array is completed if only the figure operating process is performed to the basic figure. In this case, the number of figures to be processed can be greatly reduced, compared with the case where an array is developed into figures and the figure operating process is performed to the figures. As a result, the substantial processing time of the figure operating process becomes possible to made short. Especially, in the data having many repetitive figures as in a DRAM, the number of figures to be processed can be reduced to from thousands to one in tens of thousands of minutes.

What is claimed is:

1. A method of processing figure arrays in a figure processing apparatus, comprising:

sequentially inputting first and second figure arrays;

selectively performing a fractionalizing process to divide each of figure elements of said second figure array into a plurality of types of fractions based on presence/non-presence of an overlapping portion between said first and second figure arrays and an array data of said second figure array, said array data indicating an array pitch in each of horizontal and vertical directions and a number of figures in the direction;

producing a figure array of fractions for each type and registering the produced figure arrays in chain groups which includes a chain group of said first figure array, such that the registered figure arrays have the same array data; and performing a figure operating process to said chain group, wherein said step of performing a fractionalizing process includes fractionalizing each of the figure elements of said second figure array into said plurality of types of fractions based on boundary lines of said overlapping portion, and wherein said step of fractionalizing each of the figure elements of said second figure array includes performing said fractionalizing process to divide each of figure elements of said first figure array into a plurality of types of fractions when position of said boundary lines change.

2. A method of processing figure arrays in a figure processing apparatus, comprising:

sequentially inputting first and second figure arrays;

selectively performing a fractionalizing process to divide each of figure elements of said second figure array into a plurality of types of fractions based on presence/non-presence of an overlapping portion between said first and second figure arrays and an array data of said second figure array, said array data indicating an array pitch in each of horizontal and vertical directions and a number of figures in the direction;

producing a figure array of fractions for each type and registering the produced figure arrays in chain groups which includes a chain group of said first figure array, such that the registered figure arrays have the same array data; and performing a figure operating process to said chain group, wherein said step of performing a fractionalizing process includes fractionalizing each of the figure elements of said second figure array into said plurality of types of fractions based on boundary lines of said overlapping portion, wherein said boundary lines include a first boundary line defining a top-most location of said overlapping portion and a second boundary line defining a bottom-most location of said overlapping portion, and wherein said plurality of types of fractions include a first type defined in a region above the first boundary line, a second type defined in a region between the first and second boundary lines, and a third type defined in a region below the second boundary line.

3. A figure processing apparatus comprising:

an inputting unit for sequentially inputting first and second figure arrays;

a fractionalizing unit for selectively performing a fractionalizing process to divide each of figure elements of said second figure array into a plurality of types of fractions based on presence/non-presence of an overlapping portion between said first and second figure arrays and an array data of said second figure array, said array data indicating an array pitch in each of horizontal and vertical directions and a number of figures in the direction;

a registering unit for producing a figure array of fractions for each type and registering the produced figure arrays in chain groups which includes a chain group of said first figure array, such that the registered figure arrays have the same array data; and a figure operating unit for performing a figure operating process to said chain group, wherein said fractionalizing unit fractionalizes each of the figure elements of said second figure array into said plurality of types of fractions based on boundary lines of said overlapping portion, and wherein said fractionalizing unit fractionalizes each of the figure elements of said second figure array includes performing said fractionalizing process to divide each of figure elements of said first figure array into a plurality of types of fractions when position of said boundary lines change.

* * * * *